United States Patent
Chen et al.

(10) Patent No.: US 12,557,373 B2
(45) Date of Patent: Feb. 17, 2026

(54) SEMICONDUCTOR FIN STRUCTURES

(71) Applicant: Taiwan Semiconductor Manufacturing Co., Ltd., Hsinchu (TW)

(72) Inventors: Ryan Chia-Jen Chen, Hsinchu (TW); Yih-Ann Lin, Jhudong Township (TW); Chia Tai Lin, Taichung (TW); Chao-Cheng Chen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 18/769,106

(22) Filed: Jul. 10, 2024

(65) Prior Publication Data
US 2024/0363422 A1    Oct. 31, 2024

Related U.S. Application Data

(60) Continuation of application No. 18/306,855, filed on Apr. 25, 2023, now Pat. No. 12,068,199, which is a continuation of application No. 17/239,965, filed on Apr. 26, 2021, now Pat. No. 11,670,552, which is a continuation of application No. 16/588,482, filed on
(Continued)

(51) Int. Cl.
| | |
|---|---|
| *H10D 84/03* | (2025.01) |
| *H01L 21/308* | (2006.01) |
| *H01L 21/762* | (2006.01) |
| *H10D 30/01* | (2025.01) |
| *H10D 84/01* | (2025.01) |
| *H10D 84/83* | (2025.01) |

(52) U.S. Cl.
CPC ....... *H10D 84/038* (2025.01); *H01L 21/3081* (2013.01); *H01L 21/76232* (2013.01); *H10D 30/0243* (2025.01); *H10D 84/0151* (2025.01); *H10D 84/0158* (2025.01); *H10D 84/834* (2025.01)

(58) Field of Classification Search
CPC .............. H10D 84/038; H10D 84/0151; H10D 84/0158; H10D 84/0193; H10D 84/853; H10D 84/834; H10D 30/024–0245; H10D 30/62–6219; H10D 86/011; H10D 86/215; H01L 21/3081; H01L 21/76232; H01L 21/823431; H01L 21/76205; H01L 21/76224; H01L 21/76229; H01L 21/76283; H01L 21/76286; H01L 21/823481; H10B 12/36; H10B 12/056
USPC .... 257/722, 67, 206, 390, 397, 401, 21.409, 257/21.546; 438/296, 424, 283, 300
See application file for complete search history.

(56) References Cited

U.S. PATENT DOCUMENTS

| | | | |
|---|---|---|---|
| 6,953,973 B2* | 10/2005 | Kim | ........................ H10B 41/40 257/374 |
| 7,425,500 B2 | 9/2008 | Metz et al. | |

(Continued)

*Primary Examiner* — Natalia A Gondarenko
(74) *Attorney, Agent, or Firm* — Slater Matsil, LLP

(57) ABSTRACT

A device includes a semiconductor substrate, and a plurality of semiconductor fins parallel to each other, wherein the plurality of semiconductor fins is a portion of the semiconductor substrate. A Shallow Trench Isolation (STI) region is on a side of the plurality of semiconductor fins. The STI region has a top surface and a non-flat bottom surface, wherein the plurality of semiconductor fins is over the top surface of the STI region.

20 Claims, 13 Drawing Sheets

Related U.S. Application Data

Sep. 30, 2019, now Pat. No. 10,991,627, which is a division of application No. 16/024,220, filed on Jun. 29, 2018, now Pat. No. 10,957,600, which is a continuation of application No. 15/493,663, filed on Apr. 21, 2017, now Pat. No. 10,083,872, which is a division of application No. 13/452,516, filed on Apr. 20, 2012, now Pat. No. 9,633,905.

(56) References Cited

U.S. PATENT DOCUMENTS

| | | |
|---|---|---|
| 7,534,686 B2 | 5/2009 | Lee et al. |
| 7,719,043 B2 | 5/2010 | Yamagami |
| 7,812,375 B2 | 10/2010 | Lee et al. |
| 8,541,286 B2 | 9/2013 | Park |
| 8,853,037 B2 | 10/2014 | Cho |
| 2004/0266083 A1 | 12/2004 | Hareland et al. |
| 2005/0186746 A1 | 8/2005 | Lee et al. |
| 2006/0081895 A1 | 4/2006 | Lee et al. |
| 2007/0018215 A1 | 1/2007 | Sandhu et al. |
| 2008/0149984 A1 | 6/2008 | Chang et al. |
| 2008/0296702 A1 | 12/2008 | Lee et al. |
| 2010/0015778 A1 | 1/2010 | Lin et al. |
| 2010/0252886 A1 | 10/2010 | Tang et al. |
| 2011/0263094 A1 | 10/2011 | Lin et al. |
| 2012/0003810 A1 | 1/2012 | Hwang et al. |
| 2012/0074386 A1 | 3/2012 | Rachmady et al. |
| 2012/0168897 A1 | 7/2012 | Ma et al. |
| 2012/0202330 A1 | 8/2012 | Takeda et al. |
| 2013/0026571 A1* | 1/2013 | Kawa .................. H10D 86/215 257/E21.602 |
| 2013/0045580 A1 | 2/2013 | Cho |
| 2013/0065326 A1 | 3/2013 | Sudo |
| 2013/0175620 A1* | 7/2013 | Cai .................... H10D 86/215 257/E21.409 |
| 2013/0196508 A1 | 8/2013 | LiCausi |

* cited by examiner

SEMICONDUCTOR FIN STRUCTURES

PRIORITY CLAIM AND CROSS-REFERENCE

This application is a continuation of U.S. application Ser. No. 18/306,855, filed Apr. 25, 2023, which continuation of U.S. application Ser. No. 17/239,965, filed Apr. 26, 2021, now U.S. Pat. No. 11,670,552, issued on Jun. 6, 2023, which is a continuation of U.S. application Ser. No. 16/588,482, filed Sep. 30, 2019, now U.S. Pat. No. 10,991,627, issued Apr. 27, 2021, which is a divisional of U.S. patent application Ser. No. 16/024,220, filed Jun. 29, 2018, now U.S. Pat. No. 10,957,600, issued Mar. 23, 2021, which is a continuation of U.S. application Ser. No. 15/493,663, filed Apr. 21, 2017, now U.S. Pat. No. 10,083,872 issued Sep. 25, 2018, which is a divisional of U.S. application Ser. No. 13/452,516, filed Apr. 20, 2012, now U.S. Pat. No. 9,633,905 issued Apr. 25, 2017, which applications are incorporated herein by reference.

BACKGROUND

With the increasing down-scaling of integrated circuits and the increasingly demanding requirements to the speed of integrated circuits, transistors need to have higher drive currents with smaller dimensions. Fin Field-Effect Transistors (FinFET) were thus developed. FinFETs have increased channel widths. The increase in the channel width is achieved by forming channels that include portions on the sidewalls of the fins and portions on the top surfaces of the fins.

With the increasing down-scaling of integrated circuits, fins also become increasingly thinner, and the aspect ratios of the gaps between the fins become increasingly greater. The formation processes of the fins thus are more prone to the process variations in the respective manufacturing processes. In conventional FinFET manufacturing processes, the hard masks for forming the fins are defined first. The hard masks are then used as etching masks to etch the underlying semiconductor substrates, and the patterns of the hard masks are transferred to the underlying semiconductor substrates to from fins. In the etching of the semiconductor substrates, since the hard masks have pattern-dense regions and pattern-sparse regions, the pattern loading effect causes the fins in the pattern-dense regions and the pattern-sparse regions to be different from each other. The respective FinFETs are thus adversely affected.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A method of forming semiconductor fins, which may be used for forming Fin Field-Effect Transistors (FinFETs), and the respective structures are provided in accordance with various exemplary embodiments. The intermediate stages of forming the semiconductor fins are illustrated. The variations of the embodiments are discussed. Throughout the various views and illustrative embodiments, like reference numbers are used to designate like elements.

Figure 1:
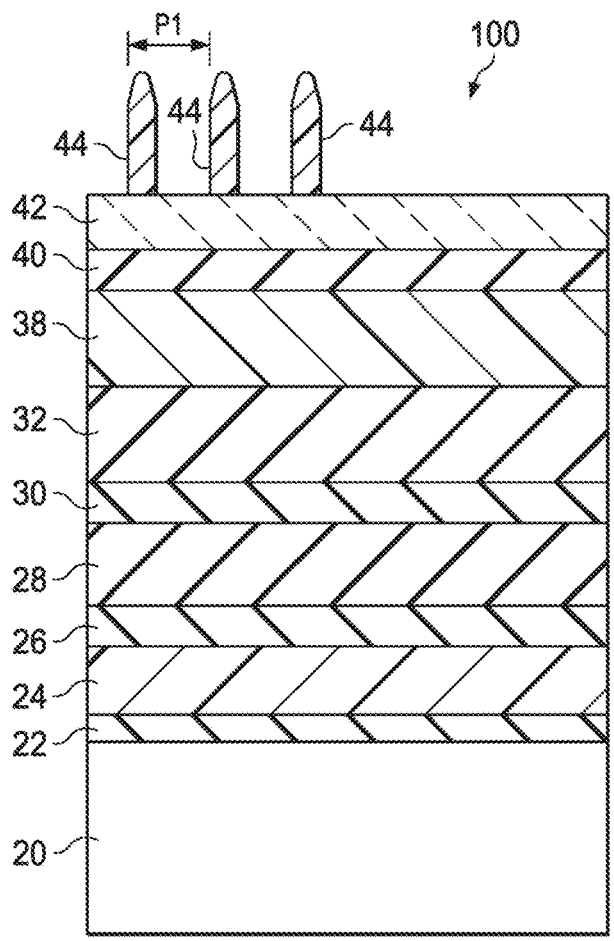
FIGS. 1-6, 7A-7B, 8A-8B, 9-15, 16A-16B, 17A-17B, and 18 are cross-sectional views of intermediate stages in the manufacturing of Fin Field-Effect Transistors (FinFET) in accordance with some exemplary embodiments.

FIGS. 1 through 18 illustrate cross-sectional views of intermediate stages in the formation of semiconductor fins, isolation regions, and FinFETs in accordance with various embodiments. FIG. 1 illustrates wafer 100, which includes substrate 20 and overlying layers. Substrate 20 may be formed of a semiconductor material such as silicon, silicon germanium, or the like. In some embodiments, substrate 20 is a crystalline semiconductor substrate such as a crystalline silicon substrate. Pad oxide layer 22 and hard mask 24 are formed over substrate 20. In accordance with embodiments, pad oxide layer 22 comprises silicon oxide. Hard mask 24 may be formed of silicon nitride.

A plurality of layers is formed over hard mask 24. In some exemplary embodiments, the plurality of layers includes oxide layers 26 and 30, hard masks 28, 32, and 38, silicon oxynitride layer 40, and Bottom Anti-Reflective Coating (BARC) 42. It is appreciated that the layers illustrated in FIG. 1 is exemplary. In alternative embodiments, different layers may be formed over substrate 20, and the number of layers may also be different from what is shown in FIG. 1. Oxide layers 26 and 30 may be Plasma Enhanced (PE) oxides, which may be silicon oxide layers that are formed using Plasma Enhanced Chemical Vapor Deposition (PECVD). Hard mask 28 and 32 may comprise an Ashing Removable Dielectric (ARD) material, and hence is referred to as ARDs 28 and 32 hereinafter, although they may also be formed of other materials. In some embodiments, hard mask 38, which may also be an ARD, may include amorphous carbon. Silicon oxynitride layer 40 may be formed over hard mask 38. BARC 42 and silicon oxynitride layer 40 may be used for lithography purposes, for example, for reducing the reflection of the yellow light used in the exposure of the overlying photo resist 44.

Figure 2:
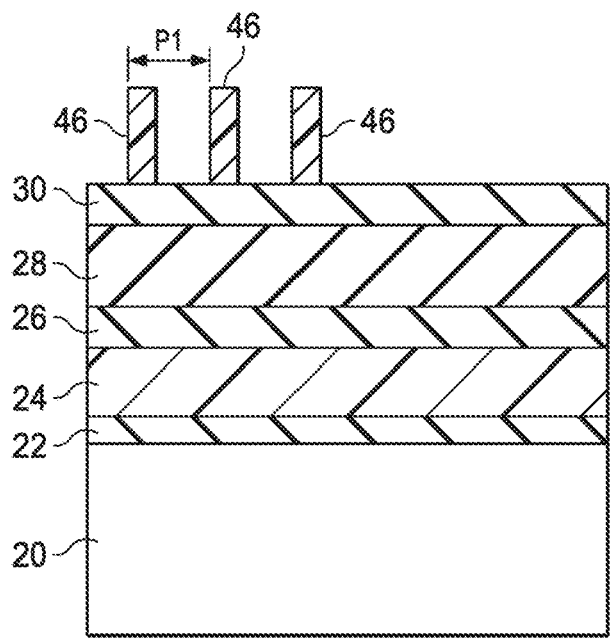

FIGS. 1 and 2 also illustrate a lithography process for patterning ARD 32. Photo resist 44 is formed over BARC 42, and is then patterned. Layers 32, 38, 40, 42, and photo resist 44 are used to form patterns with small pitches, which may be less than the minimum pitch allowed by the lithography process used for forming the integrated circuits. Layers 22, 26, 28, and 30 are used to transfer the small pitches to substrate 20. In some embodiments, the minimum pitch P1 of photo resist 44 may be close to, or equal to, the minimum pitch allowed by the technology for developing photo resist 44 and for performing the etch using photo resist 44 as an etching mask.

BARC 42, silicon oxynitride layer 40, and ARDs 38 and 32 are etched, for example, using plasma-assisted dry etching, followed by the removal of photo resist 44, BARC 42, and layers 40 and 38. The resulting structure is shown in FIG. 2. The remaining portions of hard mask 32 are referred to as mandrels 46 hereinafter. The pitches of mandrels 46 may be substantially equal to the respective pitch P1 of photo resist 44 (FIG. 1).

Figure 3:
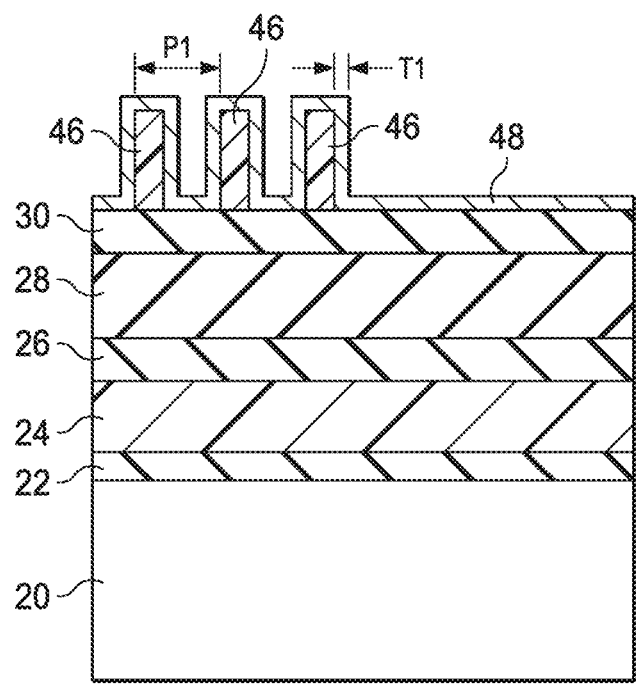

Next, as shown in FIG. 3, spacer layer 48 is deposited using a conformal deposition method. In some embodiments, spacer layer 48 is deposited using Atomic Layer Deposition (ALD), which may form a high quality film that has a low etching rate. The ALD may be performed using DiChloroSilane (DCS) and ammonia as precursors, and the resulting spacer layer 48 may include silicon nitride or silicon-rich nitride. In alternative embodiments, other conformal deposition methods, such as Low-Pressure Chemical Vapor Deposition (LPCVD), may be performed. Thickness T1 of spacer layer 48 may be less than a half of, and may be close to about a third of, pitch P1 of mandrels 46 in some exemplary embodiments.

Figure 4:
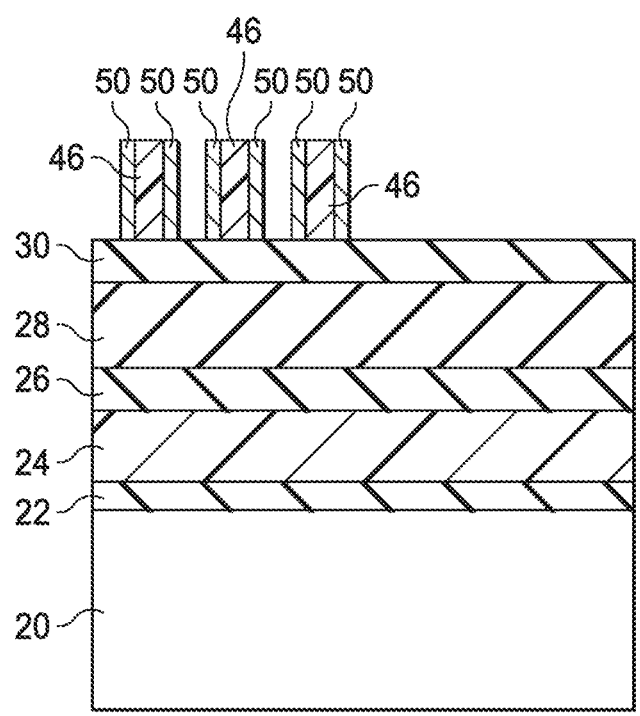
Figure 5:
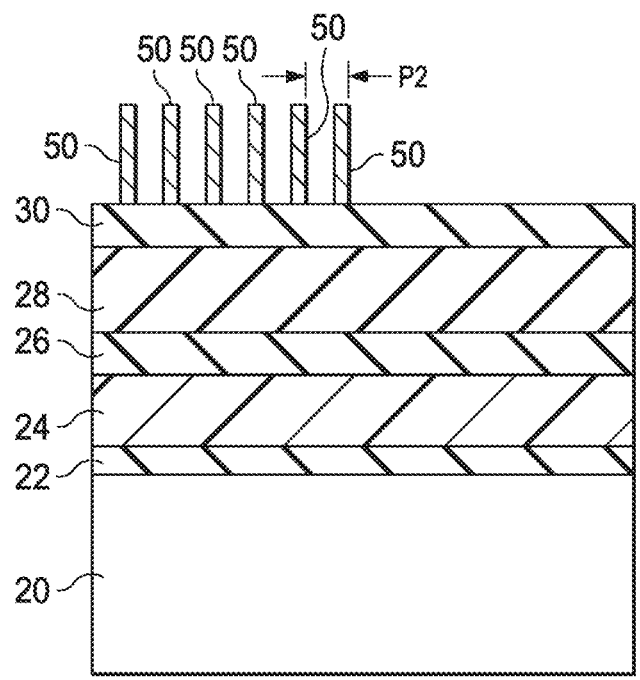

Referring to FIG. 4, the horizontal portions of spacer layer 48 are removed, for example, through an anisotropic etching step. The vertical portions of spacer layer 48 are left, and are referred to as spacers 50 hereinafter. Next, as shown in FIG. 5, mandrels 46 are removed in an etching step, and spacers 50 remain. Pitches P2 of spacers 50 may be a half of pitch P1 in FIG. 1. In some embodiments, pitch P2 is smaller than the minimum pitch.

Figure 6:
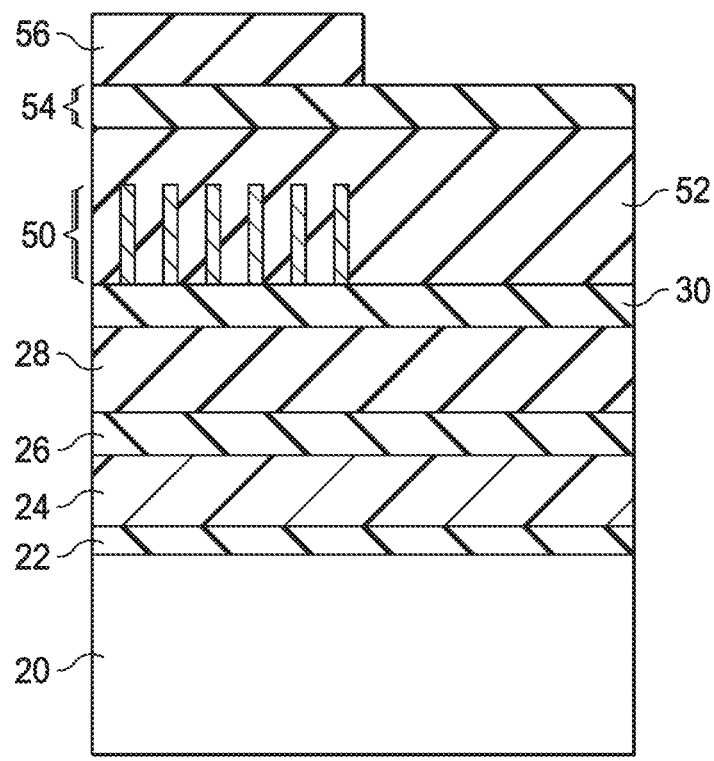

FIGS. 6 through 8B illustrate the first patterning process of spacers 50. Referring to FIG. 6, bottom layer 52 is formed over spacers 50. Bottom layer 52 may contain a photo resist. Middle layer 54 is then formed over bottom layer 52. Middle layer 54 may be formed of an oxide-like photo resist, although other materials may be used. Bottom layer 52 and middle layer 54 may be formed using spin-on coating. Following the formation of middle layer 54, photo resist 56 is formed and patterned.

Figure 7A:
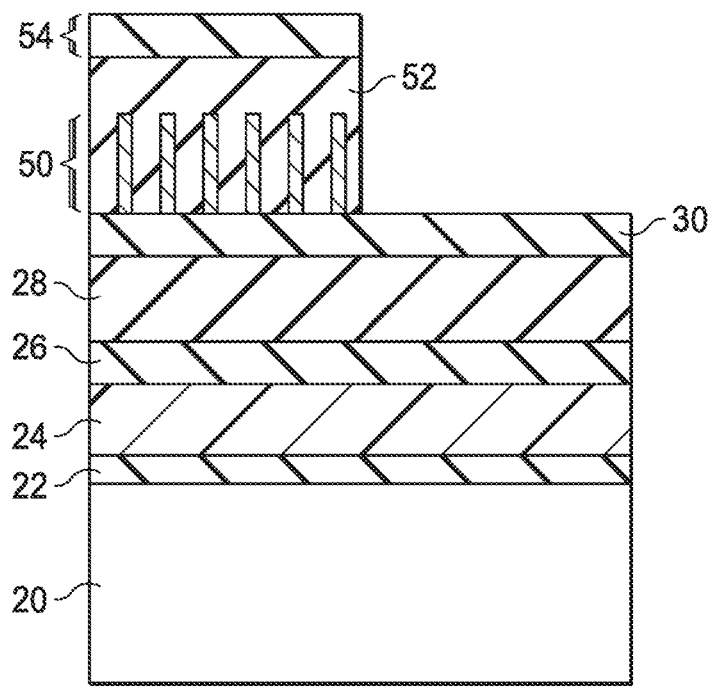
Figure 7B:
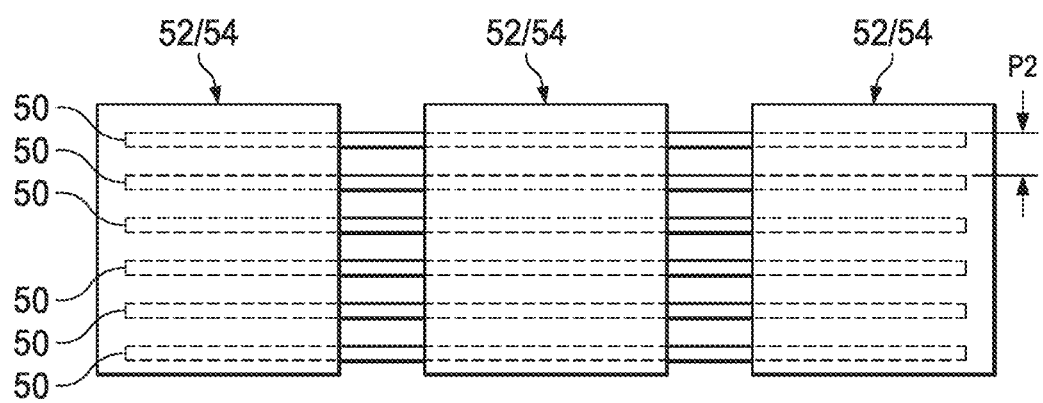

Middle layer 54 and bottom layer 52 are patterned according to the pattern of photo resist 56. Photo resist 56 is then removed. The resulting structure is shown in FIGS. 7A and 7B. FIG. 7A illustrates a cross-sectional view and FIG. 7B illustrates a top view. It is illustrated that spacers 50 include a plurality of strips that are parallel to each other. The strips 50 may have a uniform pitch P2. The patterned bottom layer 52 and middle layer 54 form masks that cover portions of spacers 50, while some other portions of spacers 50 are not covered.

Figure 8A:
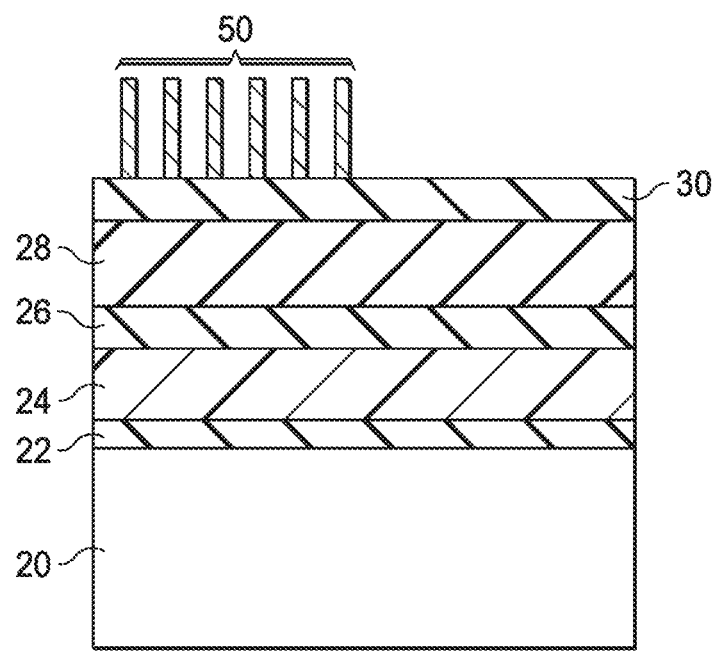
Figure 8B:
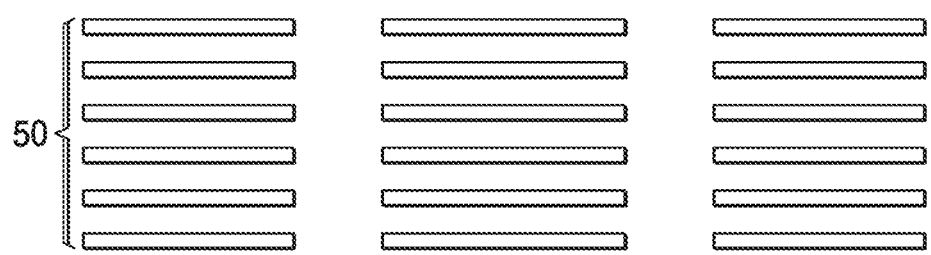

In FIGS. 8A and 8B, which are a cross-sectional view and a top view, respectively, the exposed portions of spacers 50 that are not covered by bottom layer 52 and middle layer 54 are removed. Accordingly, spacers 50 are cut into a plurality of separate shorter strips. Bottom layer 52 and middle layer 54 are then removed.

Figure 9:
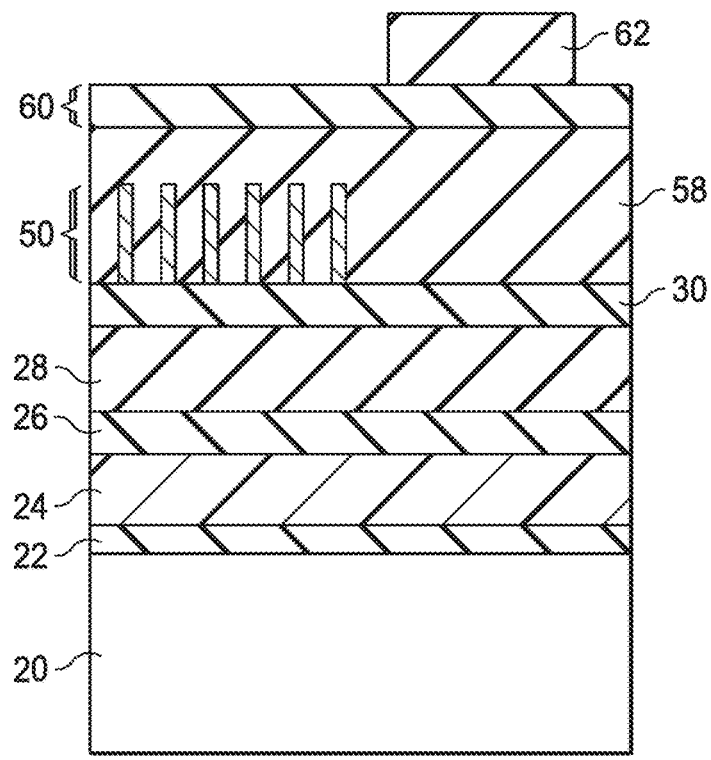
Figure 10:
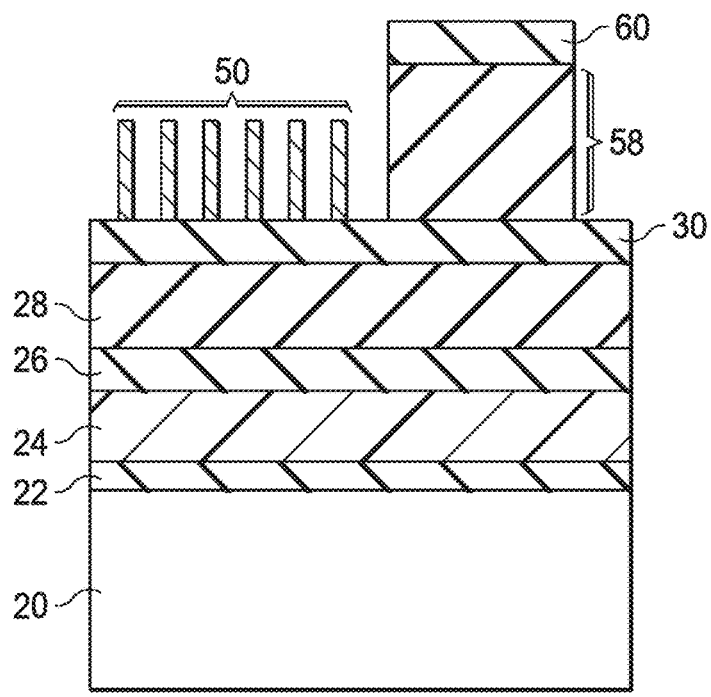
Figure 11:
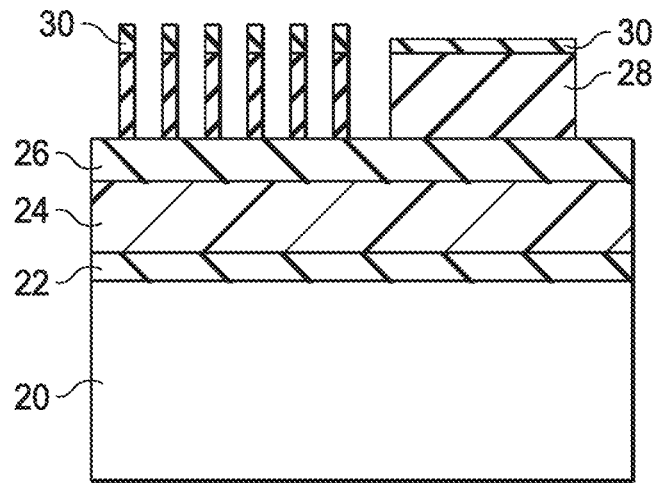

FIGS. 9 and 10 illustrate the patterning of an additional pattern that is used to etch substrate 20, which pattern may have a greater width than the widths of spacers 50. Referring to FIG. 9, bottom layer 58 and middle layer 60 are formed, and photo resist 62 is formed over layers 58 and 60, and then patterned. Bottom layer 58 and middle layer 60 are then patterned, as shown in FIG. 10. Photo resist 62 is then removed. Next, as shown in FIG. 11, hard mask layer 28 is etched using spacers 50 and the patterned bottom layer 58 and middle layer 60 as an etching mask. The patterns of spacers 50 and the patterned bottom layer 58 and middle layer 60 are thus transferred into hard mask 28.

Figure 12:
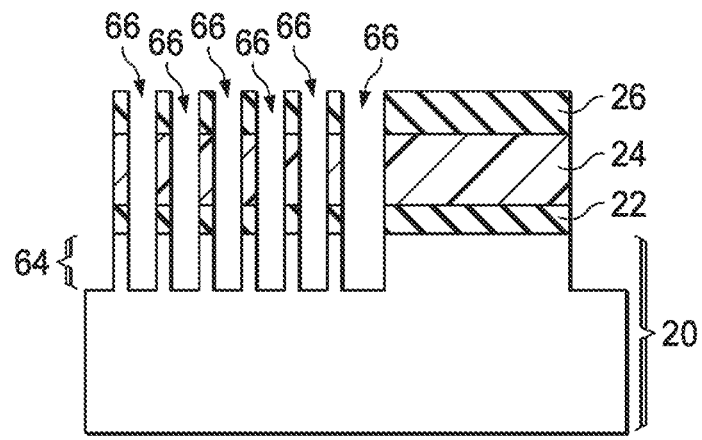

Next, hard mask 28 is used as an etching mask to etch underlying layers including pad oxide layer 22, silicon nitride layer 24, and PE oxide layer 26. Substrate 20 is also etched. Hard mask 28 is then removed, and the resulting structure is shown in FIG. 12. The portions of substrate 20 underlying spacers 50 (FIG. 10) form semiconductor fins 64. Recesses 66 are also formed in substrate 20, and separate semiconductor fins 64 from each other. Semiconductor fins 64 include two edge fins, and inner fins between the edge fins. The inner fins 64 have substantially the same width W2 (critical dimension, also see width W2 in FIG. 23) as the edge fins 64. Furthermore, the profiles of the inner fins 64 are substantially the same as that of edge fins 64, wherein the profiles may include for example, shapes, the tilt angles of edges, and the like.

Figure 13:
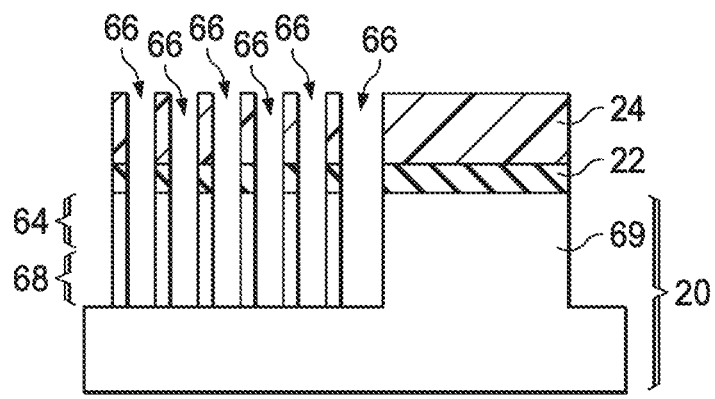

Next, as shown in FIG. 13, substrate 20 is further etched to extend recesses 66 downwardly. This step may be referred to as Shallow Trench Isolation (STI) etching since the extended portions of recesses 66 that are formed in this step will be filled to form STI regions later, while the portions of fins 64 formed in the step in FIG. 12 may be used to form the fins of FinFETs. The portions of substrate 20, which form strips between the extended portions of recesses 66, are referred to as fin extensions 68 hereinafter, although fin extensions 68 are also parts of fins. At the same time fins 64 and fin extensions 68 are formed, large active region 69 is also formed.

Figure 14:
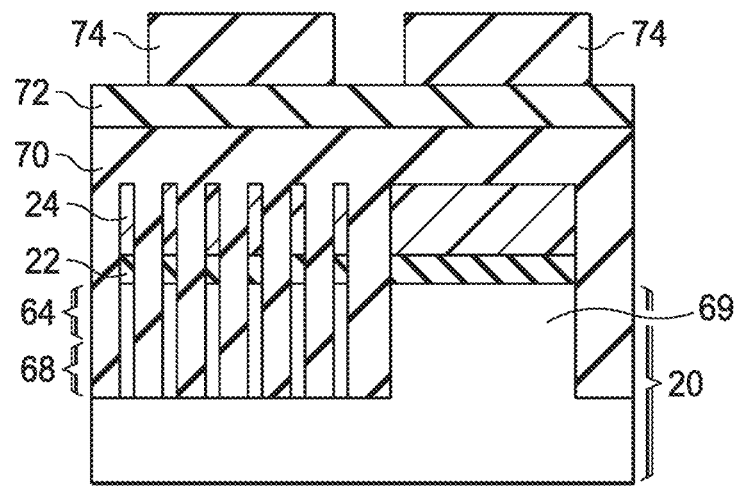
Figure 15:
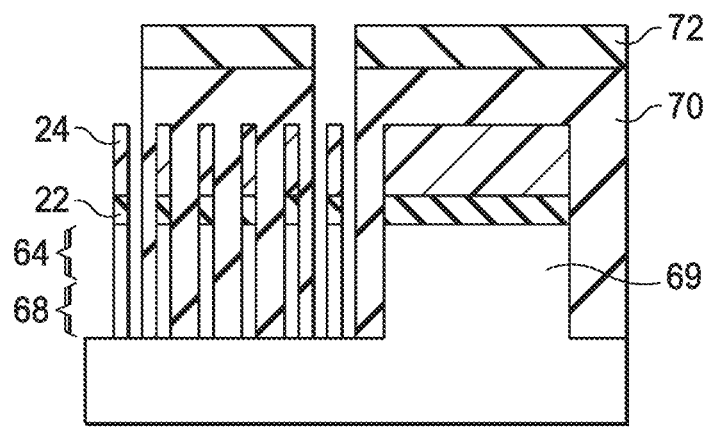

FIGS. 14 through 17B illustrate second patterning process for the further patterning of fins 64. In FIG. 14, bottom layer 70 and middle layer 72 are formed, followed by the formation and the patterning of photo resist 74. Bottom layer 70 may be formed of a material similar to the material of bottom layer 52 (FIG. 6). Middle layer 72 may also be formed of a material similar to the material of middle layer 54. Next, as shown in FIG. 15, photo resist 74 is used as an etching mask to pattern bottom layer 70 and middle layer 72. In some embodiments, the patterned bottom layer 70 and middle layer 72 overlap large active region 69 and a first plurality of fins 64, and do not overlap a second plurality of fins 64. Photo resist 74 is then removed.

Figure 16A:
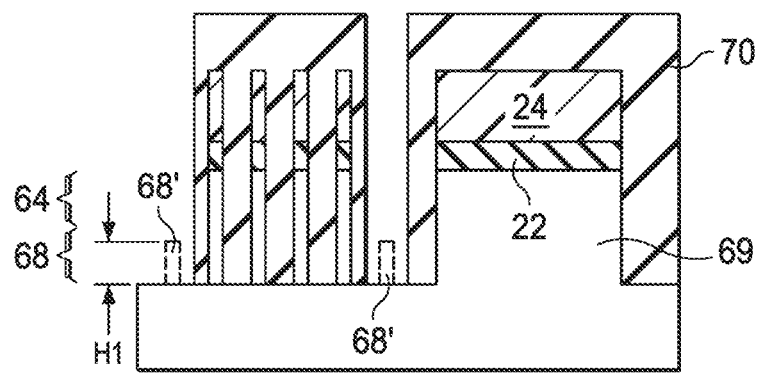
Figure 16B:
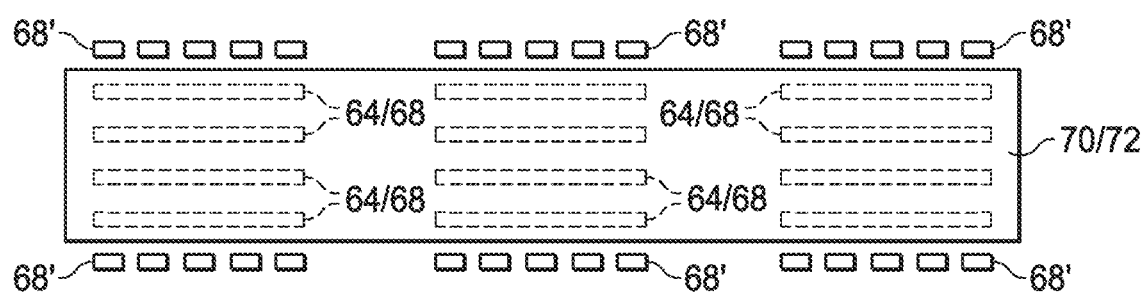
Figure 17A:
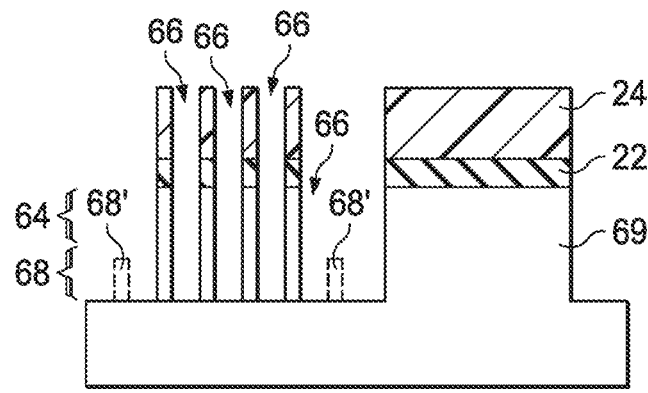
Figure 17B:
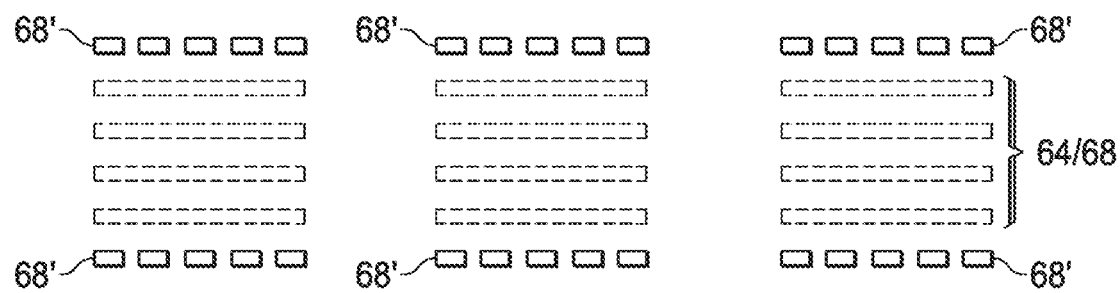

Next, as shown in FIG. 16A, the second plurality of fins 64 is removed, and the first plurality of fins 64 remains un-removed. In some embodiments, some bottom portions of fin extensions 68 also remain, and are referred to as fin extension residues 68' hereafter. The height Hi of the remaining fin extension residues 68' may be greater than about 50 Å in some embodiments, although height Hi may also be greater or smaller. FIG. 16B illustrates a top view of the structure shown in FIG. 16A, wherein fin extension residues 68' are illustrated using dashed lines. Next, as shown in FIGS. 17A and 17B, which illustrate a cross-sectional view and a top view, respectively, the patterned bottom layer 70 and middle layer 72 are removed.

Figure 18:
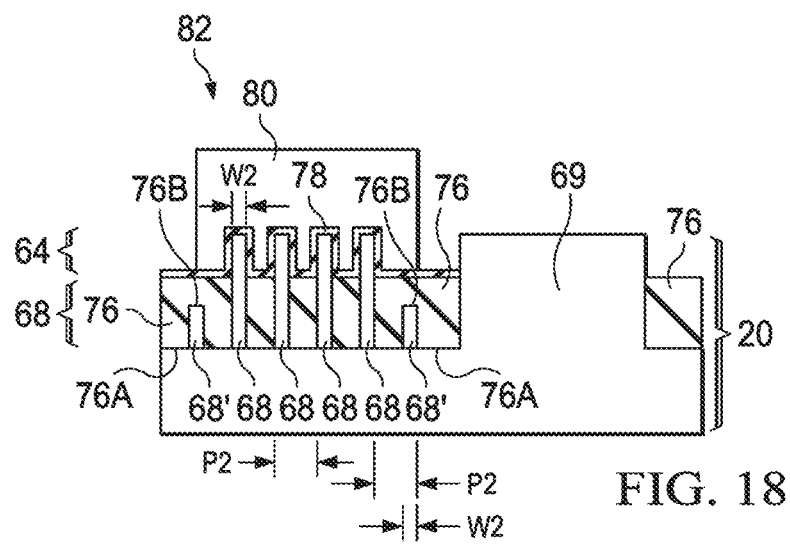
Figure 19:
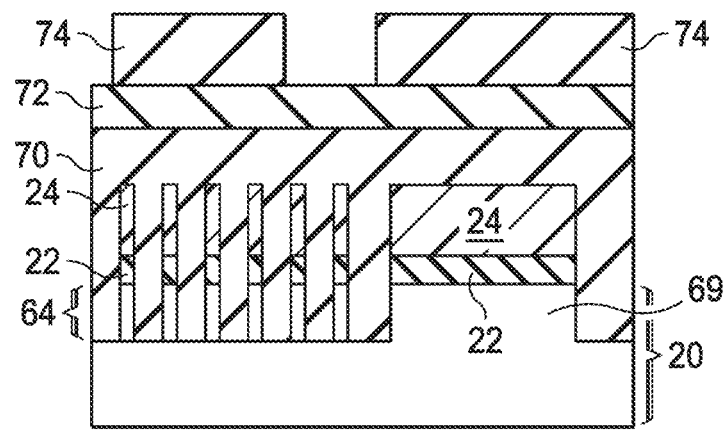
FIGS. 19-23 and 24A-24B are cross-sectional views of intermediate stages in the manufacturing of FinFETs in accordance with some alternative embodiments.

Referring to FIGS. 18, isolation regions such as STI regions 76 are filled into recesses 66, and then recessed. A Chemical Mechanical Polish (CMP) is performed to level the top surface of STI regions 76. STI regions 76 have bottom surfaces 76A substantially level with each other. Fin extension residues 68' may extend into edge STI regions 76 from the bottom surfaces of the edge STI regions 76. Furthermore, the top surfaces of fin extension residues 68' may contact bottom surfaces 76B of the edge STI region 76. The remaining portions of layers 22 and 24 are also removed.

As also shown in FIG. 18, FinFET 82 is formed on fins 64. FinFET 82 includes gate dielectric 78 and gate electrode 80. In the resulting structure, it is observed that fin extension residues 68' extend up into edge STI regions 76, and are encircled by edge STI regions 76. It is also observed that pitch P2 of fin extension residues 68' and its neighboring fin 64 may be the same as pitch P2 between neighboring fin extensions 68. Furthermore, widths W2 of fin extensions 68 may be substantially the same as widths W2 of fin extension residues 68'.

FIGS. 19 through 24B illustrate cross-sectional views of intermediate stages in the formation of fins and FinFETs in accordance with alternative embodiments. Unless specified otherwise, the materials and formation methods of the components in these embodiments are essentially the same as the like components, which are denoted by like reference numerals in the embodiments shown in FIGS. 1 through 18. The formation details of the embodiments shown in FIGS. 19 through 24B may thus be found in the discussion of the embodiments shown in FIGS. 1 through 18.

Figure 20:
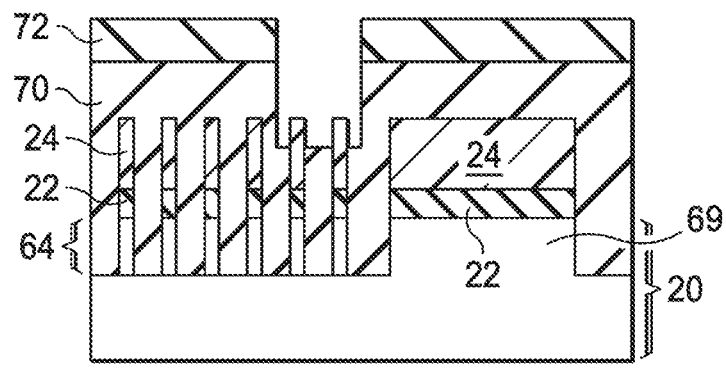
Figure 21:
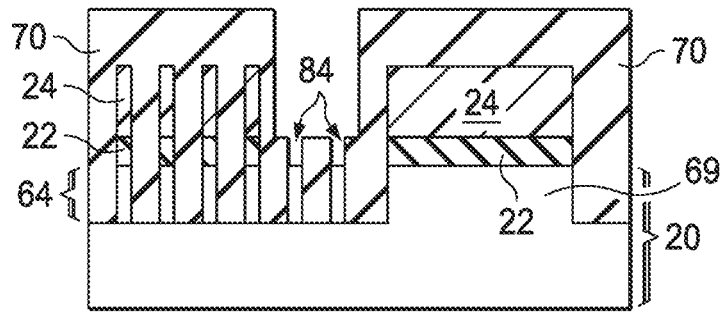
Figure 22:
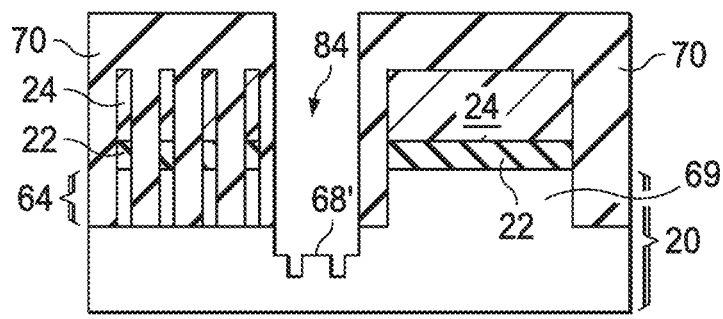

The initial steps of these embodiments are essentially the same as shown in FIGS. 1 through 12. In a subsequent step as in FIG. 19, the STI etch as shown in FIG. 13 is skipped. Instead, bottom layer 70 and middle layer 72 are formed, followed by the formation of photo resist 74. Next, as shown in FIG. 20, photo resist 74 is used as an etching mask to pattern bottom layer 70 and middle layer 72. In some embodiments, the patterned bottom layer 70 and middle layer 72 overlap large active region 69 and a first plurality of fins 64, and do not overlap a second plurality of fins 64. Photo resist 74 is then removed. In subsequent steps as shown in FIGS. 20 and 21, bottom layer 70 and middle layer 72 are used as an etching mask to etch portions of layers 22 and 24 that are not covered, until the second plurality of fins 64 is exposed. Next, as shown in FIGS. 21 and 22, the second plurality of fins 64 is etched. In some embodiments, at the same time the second plurality of fins 64 is etched, bottom layer 70 and middle layer 72 are also etched, so that recess 84 is formed in substrate 20. Bottom layer 70 and middle layer 72 are then removed, and the resulting structure is shown in FIG. 23.

Figure 23:
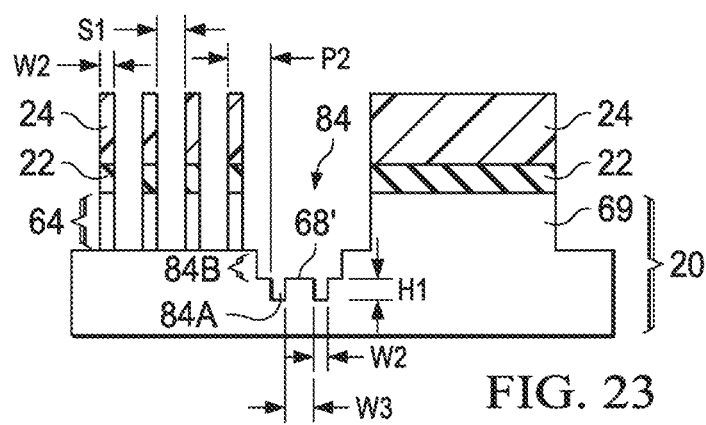

Referring to FIG. 23, fin extension residue 68' is formed as a resulting of the etching, and extends into recess 84 from bottom. Recess 84 includes portions 84A on opposite sides of fin extension residue 68'. Recess 84 further includes portion 84B over and joined to portions 84A, wherein the bottom surface of portion 84B is higher than the bottom surface of portions 84A. One of recess portions 84A may have pitch P2 from the nearest fin 64, which pitch may be the same as the pitch P2 of fins 64. Furthermore, the width W2 of recess portions 84A may be substantially the same as the width W2 of fins 64. In Addition, width W3 of fin extension residue 68' may be substantially the same as fin spacing S1 between fins 64.

Figure 24A:
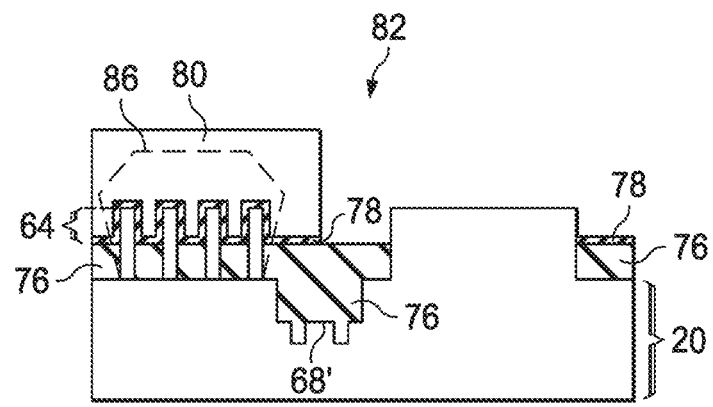

FIG. 24A illustrates the formation of FinFET 82, and the corresponding gate dielectric 78 and gate electrode 80. STI region 76 is also formed in recess 84 and then recessed. In the source and drain regions of FinFET 82, the epitaxially grown semiconductor region 86 merge with each other to form a crown-shaped region 86.

Figure 24B:
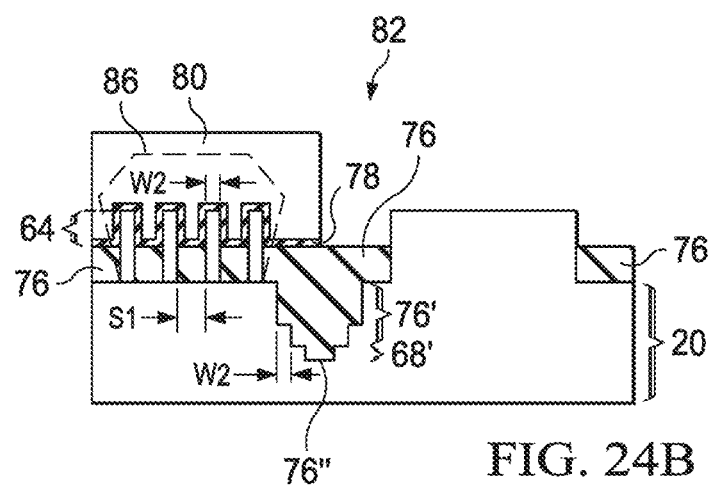

FIG. 24B illustrates FinFET 82 in accordance with alternative embodiments, wherein STI portions 76" (and the corresponding STI regions) are formed between fin extension residues 68'. STI portion 76" has a first bottom surface, whose bottom surface is lower than the bottom surface of STI portion 76'.

In FIGS. 18, 24A, and 24B, it is observed that STI regions 76 have non-flat bottom surfaces. Furthermore, the topography of the bottom surfaces of STI regions 76 reflects the patterns of spacers 50 (FIG. 5). Accordingly, the spacings and the widths of some portions of STI regions 76 are the same as the spacings and widths (such as S1, W2, W3, and the like), of respective spacers 50.

By using the embodiments, the semiconductor fins are patterned after their formation. Accordingly, since the dense and isolation regions, which are the results of the patterning, occur after the formation of fins 64, the pattern loading effect is avoided.

In accordance with embodiments, a device includes a semiconductor substrate, and a plurality of semiconductor fins parallel to each other, wherein the plurality of semiconductor fins is a portion of the semiconductor substrate. An STI region is on a side of the plurality of semiconductor fins. The STI region has a top surface and a non-flat bottom surface, wherein the plurality of semiconductor fins is over the top surface of the STI region.

In accordance with other embodiments, a device includes a semiconductor substrate, a plurality of STI regions in the semiconductor substrate, and a plurality of semiconductor fins parallel to each other and in the semiconductor substrate. A plurality of fin extensions is disposed underlying and aligned to the plurality of semiconductor fins, wherein the plurality of STI regions is disposed between the plurality of fin extensions. An edge STI region is disposed on a side of the plurality of fin extensions, wherein the edge STI region has a first bottom surface substantially level with bottom surfaces of the plurality of STI regions, and a second bottom surface higher than the first bottom surface. A fin extension residue has a bottom substantially level with bottoms of the plurality of fin extensions, wherein the fin extension residue extends into the edge STI region. A top surface of the fin extension residue is in contact with the second bottom surface of the edge STI region.

In accordance with yet other embodiments, a method includes forming a patterned mask including a plurality of strips, and etching a semiconductor substrate underlying the patterned mask to form a first and the second plurality of semiconductor fins. The patterned mask is used as an etching mask. The method further includes etching the second plurality of semiconductor fins without etching the first plurality of semiconductor fins. A recess is formed in the semiconductor substrate by the step of etching the second plurality of semiconductor fins. The recess is filled with a dielectric material to form an isolation region, wherein the first plurality of semiconductor fins is over a top surface of the isolation region.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
   a first semiconductor structure extending from a substrate;
   a second semiconductor structure extending from the substrate;
   a first isolation structure between the first semiconductor structure and the second semiconductor structure, the first isolation structure disposed above a level of the substrate; and
   a second isolation structure disposed below the level of the substrate, the second isolation structure having a first portion with a first depth measured from the level of the substrate to a first bottom surface of the second isolation structure, the first portion of the second isolation structure having a first width between first sidewalls of the substrate at the first depth, the second isolation structure having a second portion with a second depth measured from the level of the substrate to a second bottom surface of the second isolation structure, the second depth greater than the first depth, the second portion of the second isolation structure having a second width between second sidewalls of the substrate at the second depth, the second width being less than the first width, a center of the first portion of the second isolation structure being aligned with a center of the second portion of the second isolation structure in a cross-sectional view.

2. The device of claim 1, further comprising:
a third semiconductor structure extending from the substrate, the second isolation structure disposed between the second semiconductor structure and the third semiconductor structure, wherein a distance between the first semiconductor structure and the second semiconductor structure is less than a distance between the second semiconductor structure and the third semiconductor structure.

3. The device of claim 1, wherein the second isolation structure has a third portion with a third depth measured from the level of the substrate to a third bottom surface of the second isolation structure, the third depth greater than the second depth.

4. The device of claim 1, further comprising:
an epitaxial region extending continuously over the first semiconductor structure and the second semiconductor structure.

5. The device of claim 1, further comprising:
a gate structure extending continuously over the first semiconductor structure and the second semiconductor structure.

6. The device of claim 1, wherein the second width corresponds to a sum of a width of the first semiconductor structure, a width of the second semiconductor structure, and a distance between the first semiconductor structure and the second semiconductor structure.

7. The device of claim 1, further comprising:
a third semiconductor structure extending from the substrate, the second isolation structure disposed between the second semiconductor structure and the third semiconductor structure, wherein the third semiconductor structure is wider than the first semiconductor structure and the second semiconductor structure.

8. A device comprising:
a first semiconductor structure extending from a level of a substrate;
a second semiconductor structure extending from the level of the substrate;
a third semiconductor structure extending from the level of the substrate;
a first isolation structure between the first semiconductor structure and the second semiconductor structure, the first isolation structure disposed above the level of the substrate;
a second isolation structure between the second semiconductor structure and the third semiconductor structure, the second isolation structure having a upper portion disposed above the level of the substrate and having a lower portion disposed below the level of the substrate; and
a protrusion extending from the substrate and into the lower portion of the second isolation structure, wherein the protrusion is encircled by the second isolation structure, wherein the upper portion of the second isolation structure extends over the protrusion, wherein the first semiconductor structure has a first height as measured from the level of the substrate, the protrusion has a second height as measured from a bottom surface of the second isolation structure, and the second height is less than the first height.

9. The device of claim 8, wherein the protrusion has a width corresponding to a spacing between the first semiconductor structure and the second semiconductor structure.

10. The device of claim 8, wherein a portion of the second isolation structure encircling the protrusion has a same width as the first semiconductor structure and the second semiconductor structure.

11. The device of claim 8, wherein the first isolation structure and the second isolation structure comprise a same dielectric material.

12. The device of claim 8, further comprising:
a gate dielectric layer over the first semiconductor structure and the second semiconductor structure; and
a gate electrode over the gate dielectric layer.

13. The device of claim 8, wherein the first isolation structure has a first bottom surface, the second isolation structure has a second bottom surface, and the second bottom surface is lower than the first bottom surface.

14. A device comprising:
a first semiconductor structure, the first semiconductor structure comprising a first sidewall, a second sidewall, a first surface facing away from a bottom of the first semiconductor structure and extending between the first sidewall and the second sidewall, and a second surface facing away from the bottom of the first semiconductor structure, the second surface being disposed above the first surface;
a second semiconductor structure adjacent to the first semiconductor structure, the second semiconductor structure comprising a third sidewall facing the first sidewall, a fourth sidewall facing the second sidewall, a third surface facing away from a bottom of the second semiconductor structure and extending between the third sidewall and the fourth sidewall, and a fourth surface facing away from the bottom of the second semiconductor structure, the fourth surface being disposed above the third surface; and
a first isolation structure between the first semiconductor structure and the second semiconductor structure, the first isolation structure being in contact with the first sidewall, the second sidewall, the third sidewall, the fourth sidewall, the first surface, the second surface, the third surface, and the fourth surface.

15. The device of claim 14, wherein the first semiconductor structure comprises a fin and a first portion of a substrate, and wherein the second semiconductor structure comprises an active region and a second portion of the substrate.

16. The device of claim 14, wherein the first isolation structure has a non-flat bottom surface.

17. The device of claim 14, further comprising:
an epitaxial region in the first semiconductor structure.

18. The device of claim 8, further comprising:
a gate dielectric layer over the first semiconductor structure; and
a gate electrode over the gate dielectric layer.

19. The device of claim 1, further comprising:
a protrusion extending from the substrate and into the second isolation structure at a bottom surface of the second isolation structure, the second isolation structure extending over and around the protrusion.

20. The device of claim 14, wherein the first surface is level with the third surface, and the second surface is level with the fourth surface.

* * * * *